United States Patent
Kent et al.

(10) Patent No.: US 10,083,926 B1
(45) Date of Patent: Sep. 25, 2018

(54) STRESS RELIEF SOLUTIONS ON WLCSP LARGE/BULK COPPER PLANE DESIGN

(71) Applicant: Dialog Semiconductor (UK) Limited, London (GB)

(72) Inventors: Ian Kent, Chippenham (GB); Rajesh Subraya Aiyandra, Denkendorf (DE); Jesus Mennen Belonio, Jr., Neubiberg (DE); Habeeb Mohiuddin Mohammed, Weilheim (DE); Domingo Jr. Maggay, Bulacan (PH); Robert Lamoon, Portishead (GB); Ernesto Gutierrez, III, Swindon (GB)

(73) Assignee: Dialog Semiconductor (UK) Limited, London (GB)

( * ) Notice: Subject to any disclaimer, the term of this patent is extended or adjusted under 35 U.S.C. 154(b) by 0 days.

(21) Appl. No.: 15/840,842

(22) Filed: Dec. 13, 2017

(51) Int. Cl.
  *H01L 23/52* (2006.01)
  *H01L 21/44* (2006.01)
  *H01L 23/00* (2006.01)

(52) U.S. Cl.
  CPC .............. *H01L 24/04* (2013.01); *H01L 24/13* (2013.01); *H01L 2224/024* (2013.01); *H01L 2224/0235* (2013.01); *H01L 2224/0236* (2013.01); *H01L 2224/0239* (2013.01); *H01L 2224/02313* (2013.01); *H01L 2224/02321* (2013.01); *H01L 2224/02373* (2013.01); *H01L 2224/02375* (2013.01); *H01L 2224/02381* (2013.01); *H01L 2224/0401* (2013.01); *H01L 2224/13024* (2013.01); *H01L 2924/01029* (2013.01); *H01L 2924/06* (2013.01)

(58) Field of Classification Search
  CPC ......... H01L 24/04; H01L 24/13; H01L 24/03; H01L 24/02
  USPC .......................................... 257/739; 438/611
  See application file for complete search history.

(56) References Cited

U.S. PATENT DOCUMENTS

| | | | |
|---|---|---|---|
| 7,384,822 B2 | 6/2008 | Zacherl et al. | |
| 9,633,837 B2 | 4/2017 | Raghunathan et al. | |
| 9,929,112 B2* | 3/2018 | Hsieh | H01L 24/05 |
| 2017/0084558 A1* | 3/2017 | Seo | H01L 24/08 |
| 2017/0162540 A1* | 6/2017 | Ji | H01L 24/94 |

* cited by examiner

*Primary Examiner* — Luan C Thai
(74) *Attorney, Agent, or Firm* — Saile Ackerman LLC; Stephen B. Ackerman; Rosemary L. S. Pike

(57) ABSTRACT

A wafer level chip scale package is described. At least one redistribution layer is connected to a wafer through an opening through a first polymer layer to a metal pad on a top surface of the wafer wherein the redistribution layer has a roughened top surface and wherein holes are formed through the at least one redistribution layer in an area where the redistribution layer has an area exceeding 0.2 mm$^2$. At least one UBM layer contacts the at least one redistribution layer through an opening in a second polymer layer wherein the second polymer layer contacts the first polymer layer within the holes promoting cohesion between the first and second polymer layers and wherein the roughened top surface promotes adhesion between the at least one redistribution layer and the second polymer layer.

12 Claims, 2 Drawing Sheets ns
US 10,083,926 B1

STRESS RELIEF SOLUTIONS ON WLCSP LARGE/BULK COPPER PLANE DESIGN

TECHNICAL FIELD

This disclosure is related to wafer packaging technologies, and more particularly, to improved wafer level chip scale packaging.

BACKGROUND

Wafer Level Chip Scale Packaging (WLCSP) is the most compact package footprint having improved thermal and electrical performance over wirebond and other interposer packaging technologies. FIG. 1 illustrates a WLCSP structure including a redistribution layer (RDL) 18 contacting a metal pad 12 on a silicon wafer 10 through an opening in a first polymer layer 16. An under bump metal (UBM) layer 22 is formed contacting the RDL 18 through an opening in second polymer layer 20. Solder ball 24 is placed onto the UBM.

Many Outsourced Assembly and Test (OSAT) have adapted Polybenzobisoxazole (PBO) as the primary polymer passivation material for 300 mm diameter wafers. PBO (HD8820) was believed to be earth-friendly using an aqueous developer as opposed to a solvent and having a better stress buffering property than polyimide (PI). However, discoloration and delamination at the RDL/second polymer interface has been detected on a WLCSP device during early reliability testing. In power management devices, there is a very high RDL metal density (i.e. >55-75% of the die area) for better electrical and thermal performance. With such a high RDL metal density, adhesion problems between PBO and the RDL are more likely.

U.S. Pat. No. 7,384,822 (Zacherl et al) and U.S. Pat. No. 9,633,837 (Raghunathan et al) discuss adhesion between dielectric and conductor layers in a semiconductor package.

SUMMARY

It is the primary objective of the present disclosure to provide an improved wafer level chip scale package having improved adhesion between the redistribution layer and the overlying polymer layer.

It is another objective of the present disclosure to provide a process for fabricating an improved wafer level chip scale package having improved adhesion between the redistribution layer and the overlying polymer layer.

In accordance with the objectives of the present disclosure, a wafer level chip scale package is achieved. At least one redistribution layer is connected to a wafer through an opening through a first polymer layer to a metal pad on a top surface of the wafer wherein the redistribution layer has a roughened top surface and wherein holes are formed through the at least one redistribution layer in an area where the redistribution layer has an area exceeding 0.2 mm$^2$. At least one UBM layer contacts the at least one redistribution layer through an opening in a second polymer layer wherein the second polymer layer contacts the first polymer layer within the holes promoting cohesion between the first and second polymer layers and wherein the roughened top surface promotes adhesion between the at least one redistribution layer and the second polymer layer.

Also in accordance with the objectives of the present disclosure, a method to fabricate a wafer level chip scale package is achieved. A first polymer layer is deposited on a silicon wafer. An opening is etched through the first polymer layer to a metal pad on the silicon wafer. A seed layer is deposited on the first polymer layer and the metal pad. A photoresist pattern is formed on the seed layer having openings where a redistribution layer is to be plated wherein in areas where a bulk redistribution layer having an area exceeding 0.2 mm$^2$ is to be formed, a pattern of holes is formed in the photoresist. A copper redistribution layer is plated on the seed layer not covered by the photoresist pattern. The photoresist pattern is removed and the seed layer is etched away to leave the copper redistribution layer. The redistribution layer is overetched to roughen a top surface of the redistribution layer. A second polymer layer is deposited over the roughened top surface of the redistribution layer wherein the second polymer layer contacts the first polymer layer within the holes promoting cohesion between the first and second polymer layers and wherein the roughened top surface promotes adhesion between the at least one redistribution layer and the second polymer layer. At least one UBM layer is formed contacting said the redistribution layer through an opening in the second polymer layer. A solder ball is placed on the at least one UBM layer to complete the wafer level chip scale package.

BRIEF DESCRIPTION OF THE DRAWINGS

In the accompanying drawings forming a material part of this description, there is shown.

DETAILED DESCRIPTION

The present disclosure describes a structure and a process to improve the integrity of a WLCSP, especially for power management integrated circuits (PMIC). Improving the WLCSP includes 1) enhancing the WLCSP design rules and 2) improving the bumping process for the WLCSP.

The present disclosure provides a method to improve a WLCSP by preventing delamination of the RDL layer and the overlying polymer layer. We need to improve the adhesion between the PBO layer and the RDL layer. The first approach to improve the WLCSP is in the design of the package. Because of the need for high electrical performance, designing the RDL layer with a solid copper area is inevitable. The PBO adhesion to copper can be improved by designing holes in the solid metal areas as an anchoring effect. The holes will promote cohesion between the overlying and underlying polymer layers and promote a stress relief area. Since cohesion (clinging together of like molecules) is a stronger force than adhesion (clinging together of unlike molecules), the cohesion of the two polymer layers will tend to hold the second polymer layer to the first polymer layer and promote adhesion of the second polymer layer to the metal layer.

The second method to improve the WLCSP is to enhance the UBM process by increasing the Cu etch of the RDL layer to a double etching. The double copper etching will roughen the surface of the RDL metal by 25%, as found in test samples. Increasing the surface roughness provides better adhesion of the second polymer layer on top of the RDL Cu metal.

These two methods also provide stress relief by reducing warpage within the structure. Because of the magnitude of metal density within the geometry of the package, portions of the package react differently due to the different temperatures to which the package is subjected during the fabrication process. The holes promote stress relief within the metal layers and serve also as locking systems between layers.

Figure 1:
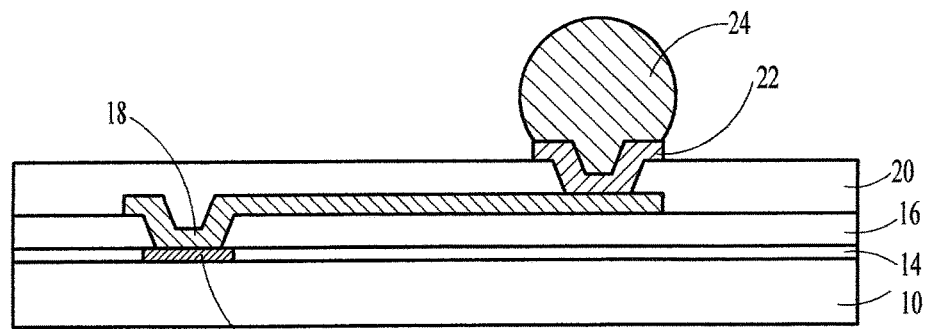
FIG. 1 is a cross-sectional representation of a wafer level chip scale package of the prior art.
Figure 2A:
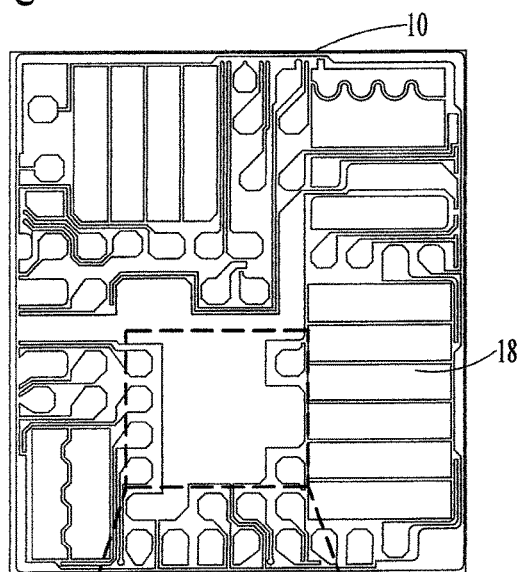
FIG. 2A is a top view of the wafer level chip scale package of the prior art.
Figure 3A:
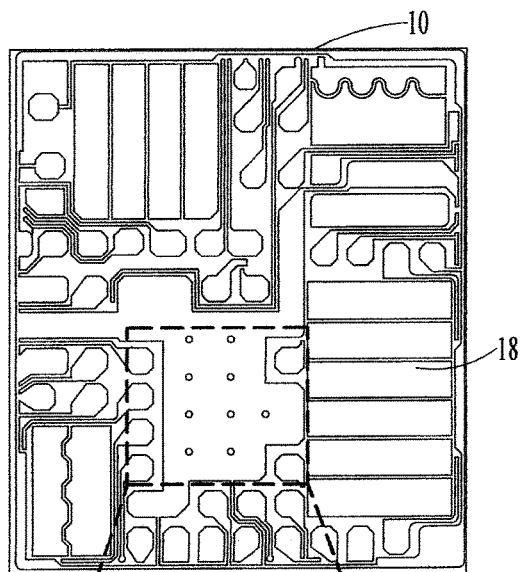
FIG. 3A is a cross-sectional representation of a wafer level chip scale package of the present disclosure.
Figure 2B:
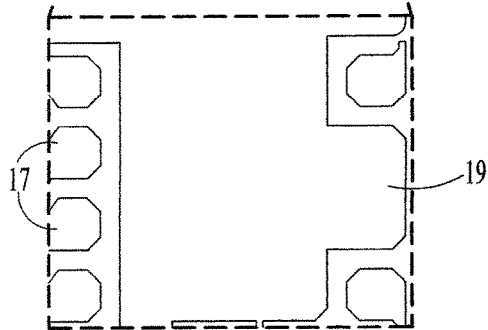
FIG. 2B is an enlarged top view of a portion of the wafer level chip scale package of the prior art.
Figure 3B:
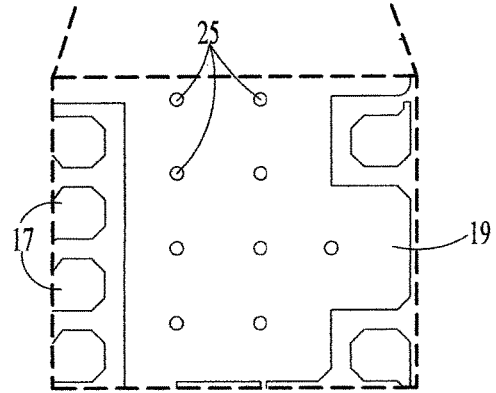
FIG. 3B is an enlarged top view of a portion of the wafer level chip scale package of the present disclosure.

FIG. 2A illustrates a top view of a traditional WLCSP showing the RDL metal 18 layout on a wafer 10. FIG. 2B is an enlarged top view of a portion of the wafer showing RDL pads 17 and large solid metal RDL area 19. FIG. 3A illustrates a WLCSP fabricated according to the method of the present disclosure. RDL metal 18 layout is shown on wafer 10. FIG. 3B shows an enlarged top view of a portion of the wafer showing RDL pad 17 and large solid metal RDL area 19.

In the process of the present disclosure, holes 25 are formed in the RDL large solid metal area 19. The holes are formed during the RDL metal formation. Holes are preferably circular or octagonal in shape and between about 70 and 90 μm in diameter and preferably about 80 μm. The number of holes is dependent on the metal density so as not to effect the electrical performance of the package. Holes are formed within any bulk RDL area exceeding approximately 0.2 mm$^2$ within the Solder Ball Area array.

Referring now to FIGS. 4-7, the process of fabricating a WLCSP of the present disclosure will be described in detail. As illustrated in FIGS. 4A and 4B, the package of the present disclosure is fabricated similarly to the traditional package. As shown in FIG. 4A, an opening is made to the aluminum pad 12 on the die 10 through the die passivation layer 14. First polymer layer 16 is deposited, then patterned to provide an opening for the RDL layer 18. Preferably, the first polymer layer comprises Polybenzobisoxazole (PBO), but polyimide (PI) or any other suitable polymer may be used. RDL layer 18 is copper. FIG. 4B illustrates another portion of the WLCSP where a large metal RDL area 19 has been formed using a plating pattern having holes 25 where the RDL 19 is not plated.

Figure 4A:
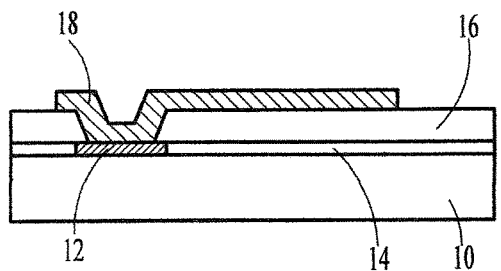
FIGS. 4A, 5A, 6A, and 7 are cross-sectional representations of steps in the process of fabricating the wafer level chip scale package of the present disclosure.
Figure 4B:
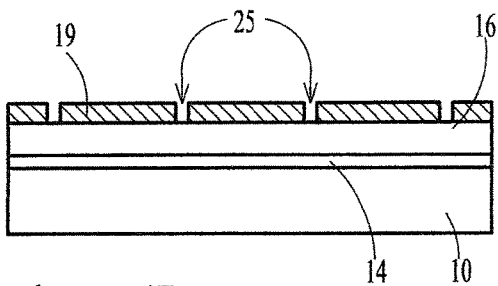
FIGS. 4B, 5B and 6B are cross-sectional representations of a portion of the wafer level chip scale package of the present disclosure having a large metal RDL area.
Figure 5A:
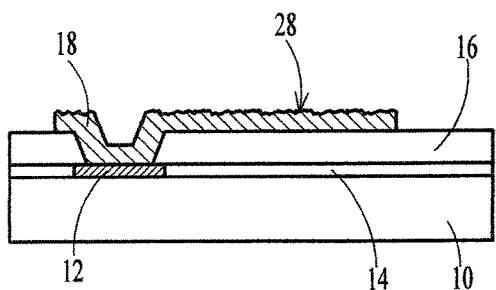
Figure 5B:
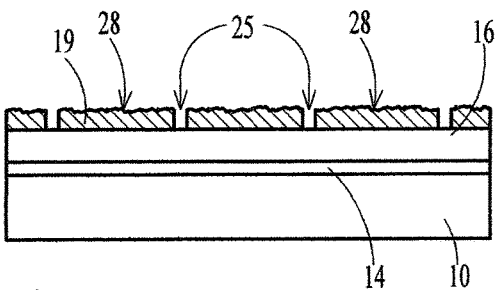

RDL layer 18 is patterned as shown in FIG. 4A. Etching is continued for twice as long as normal for a double time copper etching resulting in a roughened surface 28 of the RDL layer 18 and 19 as illustrated in FIGS. 5A and 5B, respectively. Test samples have shown that the double etching of the present disclosure roughens the RDL surface by 25%.

Figure 6A:
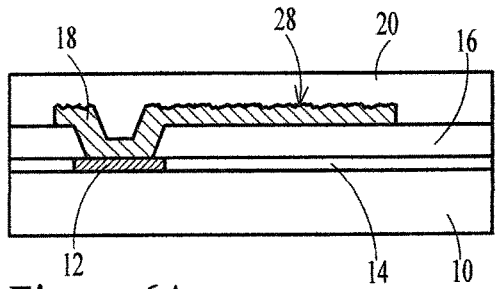
Figure 6B:
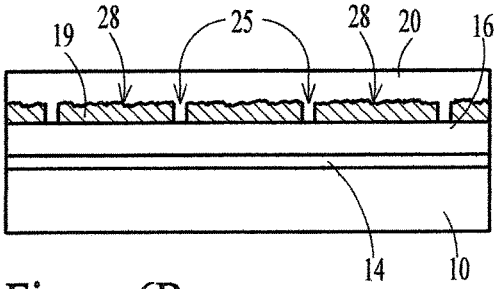
Figure 7:
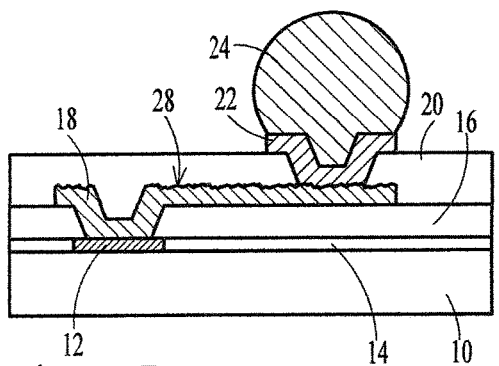

Next, a second polymer layer 20 is deposited over the patterned and roughened RDL layers 18,19, as shown in FIGS. 6A and 6B. The second polymer layer is also preferably PBO, but can instead be another polymer. The roughened surface of the underlying RDL layer improves adhesion between the RDL layer 18,19 and the second polymer layer 20. Additionally, as shown in FIG. 5B, the polymer 20 penetrates through the holes 25 in the large metal area 19 to the underlying polymer 16. The connection of the first and second polymer layers through the holes provides cohesion in addition to the adhesion between the second polymer layer and the copper layer which is enhanced by the roughened copper surface.

Processing continues as normal to pattern the polymer layer 20 to provide openings to the RDL layer 18 where UBM contacts are to be placed. UBM contacts 22 are formed and solder balls 24 are placed on the UBM contacts.

The process of the present disclosure provides an improved WLCSP with more robust adhesion between the RDL layer and the overlying polymer layer so as to avoid delamination, resulting in greater reliability.

Although the preferred embodiment of the present disclosure has been illustrated, and that form has been described in detail, it will be readily understood by those skilled in the art that various modifications may be made therein without departing from the spirit of the disclosure or from the scope of the appended claims.

What is claimed is:

1. A wafer level chip scale package comprising:
   at least one redistribution layer connected to a wafer through an opening through a first polymer layer to a metal pad on a top surface of said wafer wherein said redistribution layer has a roughened top surface and wherein holes are formed through said at least one redistribution layer in an area where said redistribution layer has an area exceeding 0.2 mm$^2$; and
   at least one UBM layer contacting said at least one redistribution layer through an opening in a second polymer layer wherein said second polymer layer contacts said first polymer layer within said holes promoting cohesion between said first and second polymer layers and wherein said roughened top surface promotes adhesion between said at least one redistribution layer and said second polymer layer.

2. The package according to claim 1 wherein said at least one redistribution layer comprises copper.

3. The package according to claim 1 wherein said first and second polymer layers comprise Polybenzobisoxazole (PBO).

4. The package according to claim 1 wherein said holes are circular or octagonal in shape and are about 80 μm in diameter.

5. A method of fabricating a wafer level chip scale package comprising:
   providing a silicon wafer;
   depositing a first polymer layer on said silicon wafer;
   etching an opening through said first polymer layer to a metal pad on said silicon wafer;
   forming at least one redistribution layer over said first polymer layer and contacting said metal pad wherein holes are formed in said at least one redistribution layer in an area where said redistribution layer has an area exceeding 0.2 mm$^2$;
   overetching said at least one redistribution layer to roughen a top surface of said redistribution layer;
   depositing a second polymer layer over roughened surface of said redistribution layer wherein said second polymer layer contacts said first polymer layer within said holes promoting cohesion between said first and second polymer layers and wherein roughened said top surface promotes adhesion between said at least one redistribution layer and said second polymer layer;
   forming at least one UBM layer contacting said at least one redistribution layer through an opening in said second polymer layer; and
   placing a solder ball on said at least one UBM layer to complete said wafer level chip scale package.

6. The method according to claim 5 wherein said first and second polymer layers comprise Polybenzobisoxazole (PBO).

7. The method according to claim 5 wherein said at least one redistribution layer comprises copper.

8. The method according to claim 5 wherein said forming said at least one redistribution layer comprises:
    depositing a seed layer on said first polymer layer;
    forming a photoresist pattern on said seed layer having openings where said redistribution layer is to be plated wherein in areas where a bulk redistribution layer having an area exceeding 0.2 mm$^2$ is to be formed, a pattern of holes is formed in said photoresist wherein said redistribution layer will not be plated in said holes;
    plating copper on said seed layer not covered by said photoresist pattern;
    removing said photoresist pattern; and
    thereafter etching away said seed layer not covered by plated said copper.

9. The method according to claim 5 wherein said holes are circular or octagonal in shape and are about 80 μm in diameter.

10. A method of fabricating a wafer level chip scale package comprising:
    providing a silicon wafer;
    depositing a first polymer layer on said silicon wafer;
    etching an opening through said first polymer layer to a metal pad on said silicon wafer;
    depositing a seed layer on said first polymer layer and said metal pad;
    forming a photoresist pattern on said seed layer having openings where a redistribution layer is to be plated wherein in areas where a bulk redistribution layer having an area exceeding 0.2 mm$^2$ is to be formed, a pattern of holes is formed in said photoresist wherein said redistribution layer will not be plated in said holes;
    plating a copper redistribution layer on said seed layer not covered by said photoresist pattern;
    thereafter removing said photoresist pattern;
    thereafter etching away said seed layer to leave said copper redistribution layer on said first polymer layer;
    thereafter overetching said redistribution layer to roughen a top surface of said redistribution layer;
    depositing a second polymer layer over roughened said top surface of said redistribution layer wherein said second polymer layer contacts said first polymer layer within said holes promoting cohesion between said first and second polymer layers and wherein said roughened top surface promotes adhesion between said at least one redistribution layer and said second polymer layer;
    forming at least one UBM layer contacting said redistribution layer through an opening in a second polymer layer; and
    placing a solder ball on said at least one UBM layer to complete said wafer level chip scale package.

11. The method according to claim 10 wherein said first and second polymer layers comprise Polybenzobisoxazole (PBO).

12. The method according to claim 10 wherein said holes are circular or octagonal in shape and are about 80 μm in diameter.

* * * * *